United States Patent [19]

Thorpe

[11] Patent Number: 4,604,570
[45] Date of Patent: Aug. 5, 1986

[54] SYSTEM FOR COMPARING CONDITIONS BETWEEN SELECTED PAIRS OF TERMINALS IN TEST CIRCUIT WITH CONDITIONS BETWEEN LIKE TERMINAL PAIRS IN REFERENCE CIRCUIT

[75] Inventor: Richard W. Thorpe, Claremont, Calif.

[73] Assignee: General Dynamics, Pomona Division, Pomona, Calif.

[21] Appl. No.: 738,824

[22] Filed: May 29, 1985

Related U.S. Application Data

[63] Continuation of Ser. No. 344,665, Feb. 1, 1982, abandoned.

[51] Int. Cl.[4] .............................................. G01R 15/12
[52] U.S. Cl. ............................ 324/73 R; 324/73 AT
[58] Field of Search .............. 324/73 R, 73 AT, 62 R, 324/51

[56] References Cited

U.S. PATENT DOCUMENTS

| | | | |
|---|---|---|---|
| 2,456,499 | 12/1948 | Fitzinger | 177/311 |
| 2,756,409 | 3/1956 | Lubkin | 340/149 |
| 2,786,988 | 3/1957 | Bergman | 340/213 |
| 2,851,657 | 9/1958 | Smith | 324/73 R |
| 2,869,076 | 1/1959 | Evans et al. | 324/51 |
| 2,875,327 | 2/1959 | Halvorson et al. | 250/6 |
| 2,939,135 | 5/1960 | Beckerich et al. | 343/14 |
| 2,994,818 | 8/1961 | Harmon | 324/451 |
| 3,065,462 | 11/1962 | Maltby et al. | 340/518 |
| 3,875,506 | 4/1975 | Cath et al. | 324/64 |
| 4,157,069 | 6/1979 | Gustafsson et al. | 102/200 |
| 4,255,792 | 3/1981 | Das | 324/73 AT |

Primary Examiner—Ernest F. Karlsen
Assistant Examiner—Walter E. Snow
Attorney, Agent, or Firm—Neil F. Martin; Russell Ben Miller; Edward B. Johnson

[57] ABSTRACT

A ballistic comparative ohmmeter for use in testing the resistance between different selected pairs of a plurality of terminals in a test circuit in comparison to the resistance between corresponding pairs of terminals in a reference circuit. the ohmmeter is particularly useful for making resistance tests in circuits included in assembled products. The ohmmeter makes comparative resistance tests during a transient response period following application of the current to the selected pair of terminals as well as under steady state conditions. Solid state stepping switches that are sequentially stepped by pulse counters are utilized to sequentially connect different combinations of terminals in the test circuit and the reference circuit. Protection circuits limit the voltages applied across the test circuit and master circuit terminals. Indicator panels immediately provide a steady state indication of the pair of terminals in the test circuit at which a fault is detected.

8 Claims, 4 Drawing Figures

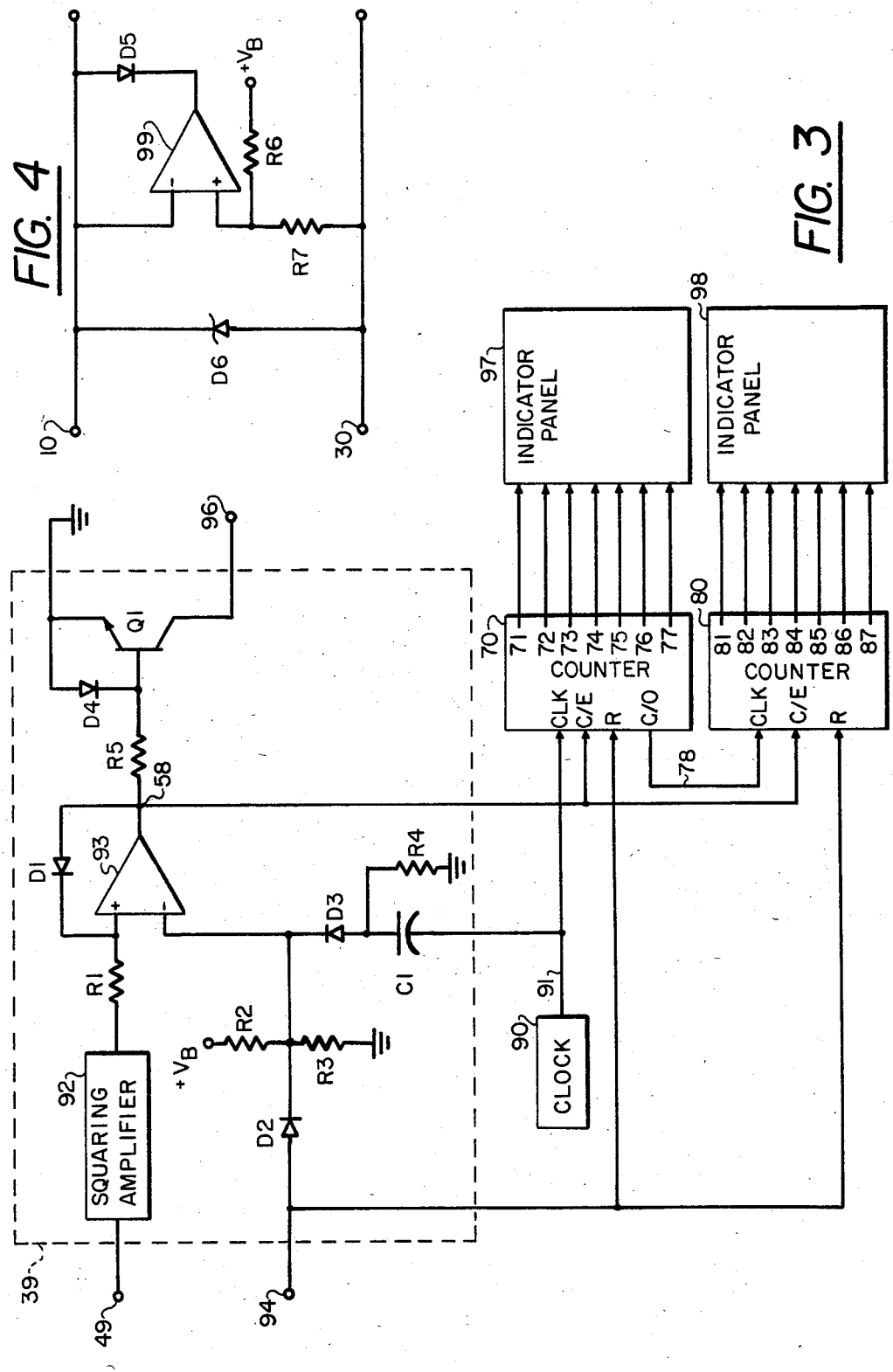

4,604,570

SYSTEM FOR COMPARING CONDITIONS BETWEEN SELECTED PAIRS OF TERMINALS IN TEST CIRCUIT WITH CONDITIONS BETWEEN LIKE TERMINAL PAIRS IN REFERENCE CIRCUIT

This is a continuation of application Ser. No. 344,665 filed Feb. 1, 1982, now abandoned.

BACKGROUND OF THE INVENTION

The present invention generally pertains to instrumentation systems and is particularly directed to an ohmmeter for testing conditions between different pairs of a plurality of terminals in a test circuit.

Oftentimes, it is difficult to accurately test electrical circuits in fully assembled products. Typically, an ohmmeter is used to test components for open and short circuits and to determine whether the component values are within specified tolerances. However, within assembled products measurements taken between a selected pair of circuit terminals connected to a specific component to be tested sometimes are distorted by the presence of other circuit components connected to one or both of the pair of terminals

SUMMARY OF THE INVENTION

The present invention provides a ballistic comparative ohmmeter for use in testing conditions between different selected pairs of a plurality of terminals in a test circuit. The ballistic comparative ohmmeter of the present invention is a system for testing the resistance between different selected pairs of a plurality of terminals in a test circuit in comparison to the resistance between corresponding pairs of terminals in a reference circuit.

The system of the present invention includes a first stepping switch having a first output terminal and a plurality of step terminals for connection respectively to the plurality of terminals in the test circuit for connecting the first output terminal to any selected one of the plurality of test circuit terminals; a second stepping switch having a second output terminal and a plurality of step terminals for connection respectively to the corresponding terminals in the reference circuit and coupled to the first stepping switch for simultaneously connecting the second output terminal to the one of the plurality of reference circuit terminals that corresponds to the test circuit terminal then selectively connected to the first output terminal by the first stepping switch; a third stepping switch having a third output terminal and a plurality of step terminals for connection respectively to the plurality of terminals in the test circuit for connecting the third output terminal to any selected one of the plurality of test circuit terminals notwithstanding the connection effected by the first stepping switch; a fourth stepping switch having a fourth output terminal and a plurality of step terminals for connection respectively to the corresponding terminals in the reference circuit and coupled to the third stepping switch for simultaneously connecting the fourth output terminal to the one of the plurality of reference circuit terminals that corresponds to the test circuit terminal then selectively connected to the third output terminal by the third stepping switch; a first constant current source connected across the first and third output terminals for causing a predetermined current to flow through any load connected between the pair of test circuit terminals respectively connected to the first and third output terminals by the first and third stepping switches; a second constant current source connected across the second and fourth output terminals for causing the predetermined current to flow through any load connected between the pair of reference circuit terminals respectively connected to the second and fourth output terminals by the second and fourth stepping switches; a differential amplifier connected to the first and second output terminals for comparing the voltages at the first and second output terminals and for providing a difference signal that indicates the difference in amplitude between the compared voltages; and a comparator for comparing the amplitude of the difference signal to a predetermined voltage threshold signal and for providing an alarm signal when the amplitude of the difference signal exceeds the predetermined threshold.

It is pointed out that the ballistic comparative ohmmeter of the present invention is used for making comparative resistance tests in contrast to measurements of resistance value and thereby is particularly useful for making resistance tests in circuits included in assembled products.

The ohmmeter of the present invention makes comparative resistance tests during a transient response period following application of the current to the selected pair of terminals as well as under steady state conditions. Accordingly, it is properly referred to as a ballistic comparative ohmmeter.

The system of present invention also preferably includes indicator panels coupled to the first and third stepping switches for indicating the pair of terminals in the test circuit that are instantaneously connected to the first and third output terminals; and logic circuit elements coupled to the comparator for keeping the stepping switches from changing the prevailing connections to the test circuit terminals when the amplitude of the difference signal exceeds the predetermined value and produces an alarm signal. As a result, an indication is immediately provided of the location in the test circuit of any condition that is not within the specified tolerances.

It is particularly important that the tests not damage any of the components in the circuit under test by applying an excessive voltage across the pairs of terminals in the test circuit and reference circuit respectively. To prevent any such damage, the system of the present invention further preferably includes matching protection circuits connected across the first and second current sources respectively for limiting the voltages at the first and second output terminals to not exceed a predetermined value with respect to the third and fourth output terminals respectively.

Additional features of the present invention are described in relation to the description of the preferred embodiment.

BRIEF DESCRIPTION OF THE DRAWING

FIG. 3 is a combination schematic and block diagram illustrating the comparator circuit of the ohmmeter of FIG. 1 and its interconnection to the clock and counters shown in FIG. 2 and further illustrating indicator panels and their interconnection to the comparator through the counters.

FIG. 4 is a schematic diamgram of the protection circuits included in the preferred embodiment of the ohmmeter of FIG. 1.

DESCRIPTION OF THE PREFERRED EMBODIMENT

Figure 1:
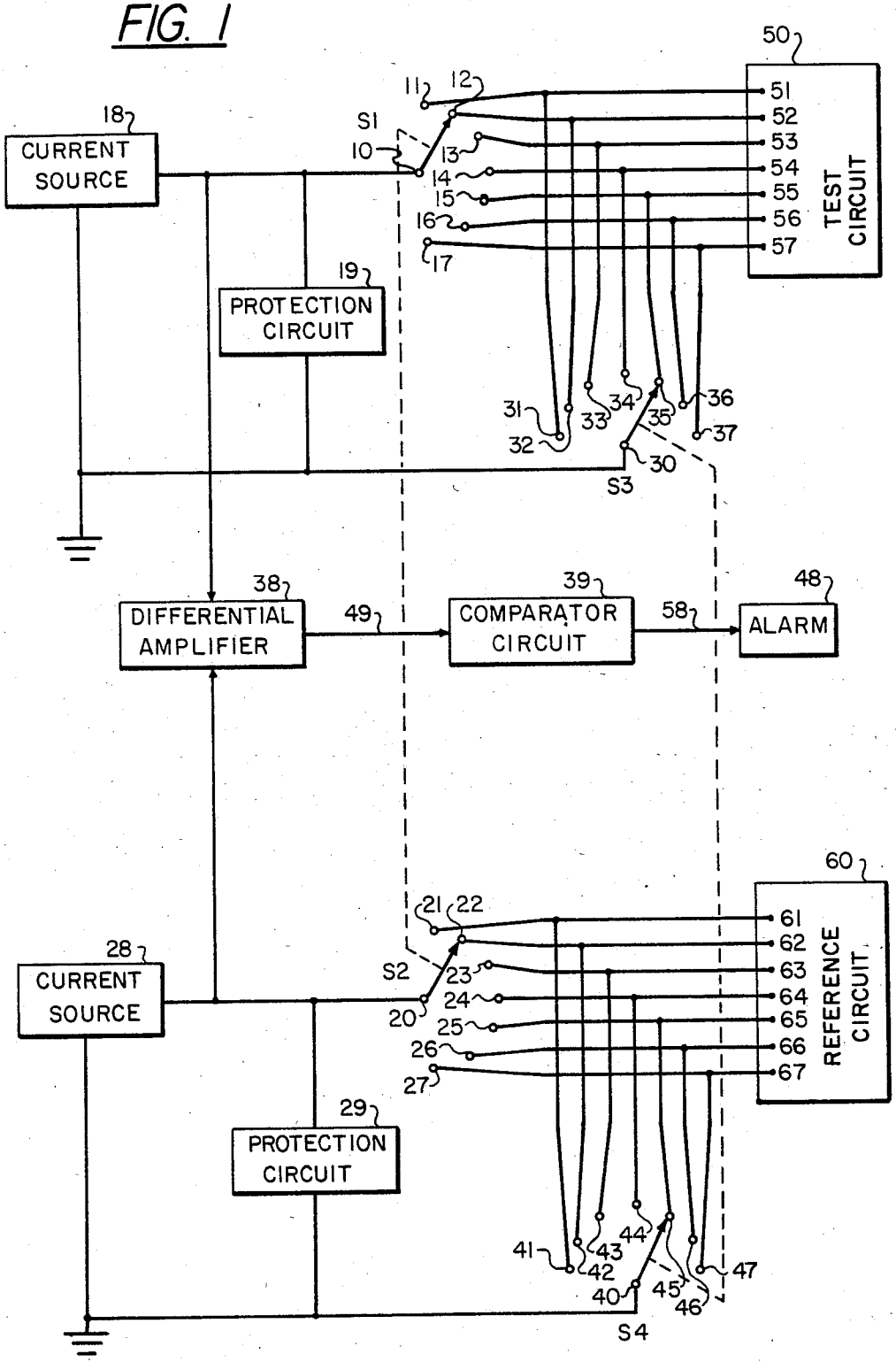
FIG. 1 is a functional block diagram of a preferred embodiment of the ballistic comparative ohmmeter of the present invention.

Referring to FIG. 1, the preferred embodiment of the ballistic comparative ohmmeter of the present invention includes a first stepping switch S1, a second stepping switch S2, and a third stepping switch S3, a fourth stepping switch S4, a first current source 18, a second current source 28, a first protection circuit 19, a second protections circuit 29, a differential amplifier 38, a comparator circuit 39 and an alarm device 48.

The ohmmeter is shown connected to a test circuit 50 and a reference circuit 60. The test circuit 50 is tested to ascertain whether the resistances, open and short circuits and transient responses therein are identical to like conditions in the reference circuit 60. The test circuit 50 includes a number of terminals 51, 52, 53, 54, 55, 56, 57 for enabling test of selected circuit conditions. The reference circuit 60 includes corresponding terminals 61, 62, 63, 64, 65, 66, 67 for enabling a comparative test of the same selected circuit conditions in the reference circuit 60.

The first stepping switch S1 has a first output terminal 10 and a plurality of step terminals 11, 12, 13, 14, 15, 16, 17 for connection respectively to a plurality of terminals 51, 52, ..., 57 in the test circuit 50 for connecting the first output terminal 10 to a selected one of the plurality of test circuit terminals 51, 52, ..., 57.

The second stepping switch S2 has a second output terminal 20 and a plurality of step terminals 21, 22, 23, 24, 25, 26, 27 for connection respectively to the corresponding terminals 61, 62, ... 67 in the reference circuit 60; and is coupled to the first stepping switch S1 for simultaneously connecting the second output terminals 20 to the one of the plurality of reference circuit terminals 61, 62, ..., 67 that corresponds to the test circuit terminals 51, 52, ..., 57 then selectively connected to the first output terminal 10 by the first stepping switch S1.

The third stepping switch S3 has a third output terminal 30 and a plurality of step terminals 31, 32, 33, 34, 35, 36, 37 for connection respectively to the plurality of terminals 51, 52, ..., 57 in the test circuit 50 for connecting the third output terminal 30 to a selected one of the plurality of test circuit terminals 51, 52, ..., 57.

The fourth stepping switch S4 has a fourth output terminal 40 and a plurality of step terminals 41, 42, 43, 44, 45, 46, 47 for connection respectively to the corresponding terminals 61, 62, ..., 67 in the reference circuit 60; and is coupled to the third stepping switch S3 for simultaneously connecting the fourth output terminal 40 to the one of the plurality of reference circuit terminals 61, 62, ..., 67 that corresponds to the test circuit terminal 51, 52, ..., 57 then selectively connected to the third output terminal 30 by the third stepping switch S3.

The first constant current source 18 is connected across the first and third output terminals 10, 30 for causing a predetermined current "I" to flow through any load connected between the pair of test circuit terminals 51, 52, ..., 57 respectively connected to the first and third output terminals 10, 30 by the first and third stepping switches S1, S3.

The second constant current source 28 is connected across the second and fourth output terminals 20, 40 for causing the predetermined current "I" to flow through any load connected between the pair of reference circuit terminals 61, 62, ..., 67 respectively connected to the second and fourth output terminals 20, 40 by the second and fourth stepping switches S2, S4.

The differential amplifier 38 is connected to the first and second output terminals 10, 20 for comparing the voltages at the first and second output terminals 10, 20 and for providing a difference signal on line 49 that indicates the difference in amplitude between the compared voltages.

The comparator circuit 39 is connected to the differential amplifier 38 for comparing the amplitude of the difference signal on line 49 to a predetermined voltage threshold signal provided within the comparator circuit 39, and for providing an alarm signal on line 58 when the amplitude of the difference signal on line 49 exceeds the predetermined threshold.

The alarm device 48 is connected to the comparator circuit 39 for providing an alarm indication in response to the alarm signal on line 58.

The protection circuits 19 and 29 are matching circuits that are connected across the first and second current sources 18 and 28 respectively for limiting the voltages at the first and second output terminals 10, 20 to not exceed a predetermined voltage with respect to the third and fourth output terminals 30, 40 respectively. The third and fourth output terminals 30, 40 are at circuit ground. The predetermined voltage is selected to be below a level that would result in damage to any component in the test circuit 50 or the reference circuit 60 during comparative testing with the ohmmeter of the present invention.

Figure 2:
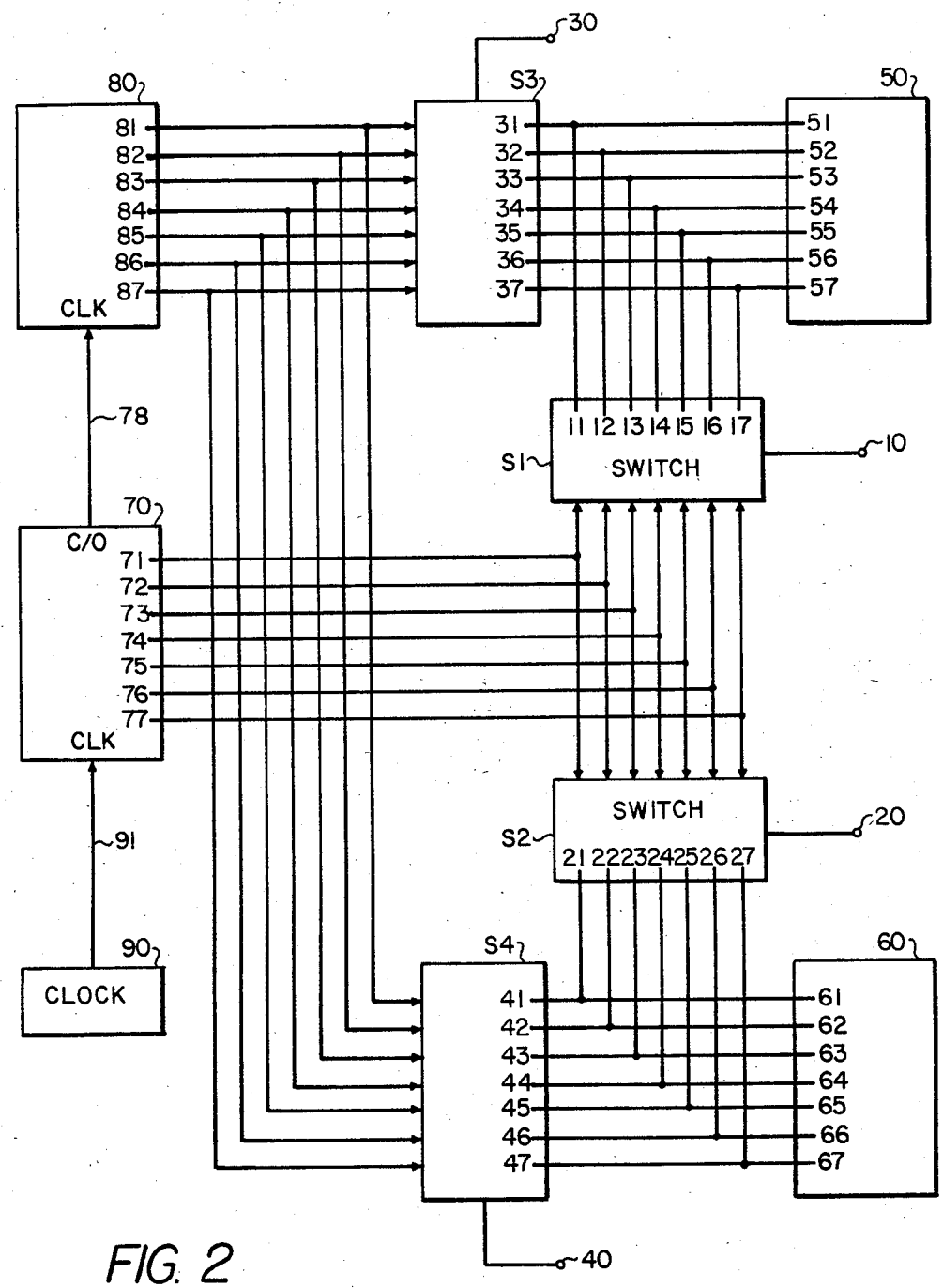
FIG. 2 is a block diagram illustrating the connections to solid state stepping switches included in the preferred embodiment of the ohmmeter of FIG. 1.

Referring to FIG. 2, the stepping switches S1, S2, S3, S4 are solid state switches. Each of the stepping switches can be automatically stepped through a sequence of different connections of the respective step terminals to the output terminal. Each of the stepping switches S1, S2, S3, S4 includes a number of discrete CMOS field effect transistors (FET's). One FET is connected to each of the step terminals. Each FET has one of its conduction terminals (source/drain) connected to one of the step terminals of the stepping switch and its other conduction terminal connected to the output terminal of the stepping switch. When a gating signal is provided at the gate terminal of the FET, the FET connects the step terminal to the output terminal.

The step terminals 11, 12, ..., 17 of the first stepping switch S1 are connected respectively to the terminals 51, 52, ..., 57 of the test circuit 50. The step terminals 21, 22, ..., 27 of the second stepping switch S2 are connected respectively to the terminals 61, 62, ..., 67 of the reference circuit 60. The step terminals 31, 32, ..., 37 of the third stepping switch S3 are connected respectively to the terminals 51, 52, ..., 57 of the test circuit 50. The step terminals 41, 42, ..., 47 of the fourth stepping switch S4 are connected respectively to the terminals 61, 62, ..., 67 of the reference circuit 60.

The preferred embodiment of the ohmmeter of the present invention includes a logic circuit for automatically sequentially stepping the stepping switch S1, S2, S3, S4 through all of their possible combinations of connections with respect to each other. The logic circuit includes a first counter 70, a second counter 80 and a clock 90.

The clock 90 provides a square wave clock signal on line 91 to the CLOCK input (CLK) of the first counter 70.

The first and second counters 70, 80 are programmable counters. The first counter has count terminals 71, 72, 73, 74, 75, 76, and 77. The second terminal has count terminals 81, 82, 83, 84, 85, 86, 87. Each of the counters 70, 80 is programmed to provide count signals at its count terminals in sequence in response to a count of the leading edges in the square wave signal provided to its clock input. For example, the first counter 70 provides a count signal at only its first count terminal 71 in response to the first leading edge in the clock signal on line 91; provides a count signal at only its second count terminal 72 in response to the second leading edge in the clock signal on line 91; and so forth.

Upon reaching a count of "seven", the first programmable counter 71 recycles through its sequence. At the beginning of each sequence, the first counter 70 provides a clock pulse at its carry output (c/o) to the clock input of the second counter 80 via line 78. Thus a count signal is provided at count terminal 81 of the second counter 80 while the first counter 70 sequentially provides count signals at each of its count terminals 71, 72, . . . 77; and a count signal is provided at count terminal 82 of the second counter 80 while the first counter 70 again sequentially provides count signals at each of its count terminals 71, 72, . . . , 77; and so forth.

The count terminals of the first and second counters 70, 80 are connected respectively to the gate terminals of the FET's in the four stepping switches S1, S2, S3, S4. The count signals serve as gating signals for the FET's. The count terminals of the first counter 70 are connected respectively to the gate terminals of the FET's in the first stepping switch S1 and to the gate terminals of the FET's in the second stepping switch S2. The count terminals of the second counter 80 are connected respectively to the gate terminals of the FET's in the third stepping switch S3 and to the gate terminals of the FET's in the fourth stepping switch S4. The specific interconnections are shown in FIG. 2; where it is seen, for example, that the count terminal 71 of the first counter 70 is connected to the gate terminal of the FET that is connected to the step terminal 11 in the first stepping switch S1, and also is connected to the gate terminal of the FET that is connected to the step terminal 21 in the second stepping switch S2. Thus when a count signal is provided at the count terminal 71 of the first counter 70, the FET's connected thereto respectively connect the test circuit terminal 51 to the output terminal 10 of the first stepping switch S1, and the reference circuit terminal 61 to the output terminal 20 of the second stepping switch S2. In order to provide gating signals of proper polarity for the FET's in the stepping switches S1, S2, S3, S4, it may be necessary to connect logic inverters (not shown) between each count terminal and the gate terminanl of the FET to which the count terminal is connected.

Upon examination of FIG. 2, it is seen that the second counter 80 is coupled to the third and fourth stepping switches S3, S4 for causing the third and fourth stepping switches S3, S4 to automatically sequentially connect each of the corresponding selected terminals in the test circuit 50 and the reference circuit 60 to the third and fourth output terminals 30 and 40 respectively; and that the first counter 70 is coupled to the second counter 80 and to the first and second stepping switches S1, S2 for causing the first and second stepping switches S1, S2 to automatically sequentially connect each of the corresponding selected terminals in the test circuit 50 and the reference circuit 60 to the first and second output terminals respectively during each sequential connection effected by the third and fourth stepping switches S3, S4.

Accordingly, all forty-nine combinations of terminals in the test circuit 50 and the master current 60 are connected to the output terminals 10 and 30 and 20 and 40 respectively for testing the different selected conditions in the test circuit 50. It will be apparent to those skilled in the art that alternative interconnections between the counters 70, 80 and the stepping switches S1, S2, S3, S4 can be utilized to provide the forty-nine different combinations of terminal connections.

Referring to FIG. 3, the comparator circuit 39 includes a squaring amplifier 92, a comparator 93, an input resistance R1, a resistance network R2, R3, a differentiating network R4, C1, a coupling resistance R5, an npn bipolar transistor Q1 and diodes D1, D2, D3 and D4.

The squaring amplifier 92 squares the difference signal on line 49 from the differential amplifier 38 (FIG. 1) in order to provide an absolute value signal for comparison with the threshold signal. The absolute value signal from the squaring amplifier 92 is provided via the resistance R1 to the non-inverting input of the comparator 93.

A predetermined voltage threshold signal is provided to the inverting input of the comparator 93 by the resistance network R2, R3. In the resistance network R2, R3, the resistance R2 is connected between the inverting input of comparator 93 and a DC bias voltage source $V_B$; and the resistance R3 is connected between the inverting input of the comparator 93 and circuit ground.

The differentiating network R4, C1 differentiates the clock signal on line 91 from the clock 90 in order to provide a spike signal to the inverting input of the comparator 93 coincident with the leading edge of each square wave pulse in the clock signal, and thereby inhibits operation of the comparator 93 during the transistion from one step terminal to another by the stepping switches S1, S2, S3, S4.

The comparator 93 also is inhibited by a pulse signal applied at terminal 94 at the beginning of each test sequence for resetting the counters 70 and 80. The pulse signal at terminal 94 is provided to the reset terminals (R) of the counters 70 and 80 and to the inverting input of the comparator 93.

The diode D1 is coupled across the output and the noninverting input of the comparator 93 for enabling current to be fedback to the non-inverting input. The diode D2 is connected between the terminal 94 and the inverting input of the comparator 93 for preventing current from being fedback to the terminal 94 when a signal is provided to the inverting input from the clock 90. The diode D3 is connected between the differentiating network R4, C1 and the inverting input of the comparator 93 for preventing current from being fed to the clock input of the counters 70, 80 when a reset signal is provided at the terminal 94.

The comparator 93 compares the voltage of the absolute value signal from the squaring amplifier 92 with the voltage at its inverting input terminal and provides an alarm signal at terminal 58 when the voltage of the absolute value signal exceeds the predetermined threshold voltage.

In the conditioning circuit, the transistor Q1 has its collector connected to an output terminal 96 and its emitter connected to circuit ground. The diode D4 is connected between the emitter and the base for enabling current flow from the emitter to the base, thereby limiting the back voltage that may be developed across the baseemitter diode of Q1. The conditioning circuit conditions the alarm signal provided from terminal 58 via the resistance R5 in order to provide a signal at the output terminal 96 at a level that is appropriate for operating the alarm device 48.

The alarm signal at terminal 58 also is provided to the clock enable inputs (C/E) of the counters 70, 80 in order to inhibit the counters 70, 80 from counting further once an alarm signal is provided at terminal 58. The count terminals 71, 72, ..., 77; 81, 82, ..., 87 of the counters 70, 80 are respectively provided to indicator panels 97, 98. The indicator panels respond to the count signals at the count terminals of the counters 70, 80 to provide a visual indication of the pair of terminals in the test circuit 50 that are instantaneously connected to the first and third output terminals 10, 30. Thus the provision of the alarm signal at terminal 58 to the clock enable inputs of the counters, 70, 80 keeps the stepping switches S1, S2, S3, S4 from changing the prevailing connection to the test circuit 50 when the amplitude of the difference signal exceeds the predetermined value that results in the provision of an alarm signal; and causes the indicator panels to immediately provide a steady-state indication of the pair of terminals in the test circuit 50 at which the fault indicated by the alarm signal occurred.

For simplicity of illustration, the interconnections between the counters 70, 80 and the stepping switches S1, S2, S3, S4, as shown in FIG. 2, are not also shown in FIG. 3.

Referring to FIG. 4, the protection circuit (FIG. 1) includes an operational amplifier 99 a resistance network R6, R7 a diode D5, and a Zener diode D6. In the resistance network R6, R7, the resistance R6 is connected between the non-inverting input of the amplifier 99 and a DC bias voltage source $V_B$; and the resistance R7 is connected between the non-inverting input of the amplifier 99 and the third output terminal 30. The inverting input of the operational amplifier 99 is connected to the first output terminal 10. The diode D5 is connected between the output of the operational amplifier 99 and the first output terminal 10 for preventing current flow from the output of the amplifier 99 to the first output terminal 10. This portion of the protection circuit limits the voltage between the first and third output terminals 10 and 30 as does the Zener diode D6 connected in parallel therewith, but is capable of limiting such voltage to lower values in comparison to Zener diodes. The operation of the portion of the protection circuit utilizing the operational amplifier 99 is more completely described in U.S. patent application Ser. No. 311,489 filed Oct. 15, 1981 by the inventor herein, entitled "Active Zener Diode Substitute Circuit", now U.S. Pat. No. 4,378,521 issued Mar. 29, 1983. The disclosure of such application is incorporated herein by reference thereto.

The Zener diode D6 is connected between the first and third output terminals 10, 30 to provide backup protection in the event the other portion of the protection circuit should fail.

The second protection circuit 29 connected between the second and fourth output terminals 20, 40 is identical to the first protection circuit 19 shown in FIG. 4.

I claim:
1. A system for testing the impedance between different selected pairs of test terminals in a plurality of test terminals of linear and nonlinear test circuits in comparison to the impedance between corresponding pairs of reference terminals in a plurality of reference terminals of corresponding linear and non linear reference circuits during a transient response period, comprising:
  first stepping switch means having a first output terminal and a first plurality of input terminals, each input terminal in said first plurality of input terminals adapted for connection to a respective one in a plurality of test terminals, for connecting said first output terminal to any selected input terminal in said first plurality of input terminals;
  second stepping switch means having a second output terminal and a second plurality of input terminals, each input terminal in said second plurality of input terminals corresponding to an input terminal in said first plurality of input terminals and adapted for connection to a respective one in a plurality of reference terminals which corresponds to a respective one in a plurality of test terminals, for simultaneously connecting said second output terminal to an input terminal of said second plurality of input terminals that corresponds to the input terminal of said first plurality of the input terminals then selectively connected to said first output terminal by said first stepping switch means;
  third stepping switch means having a third output terminal and a third plurality of input terminals, each input terminal in said third plurality of input terminals adapted for connection to a respective one in a plurality of test terminals, for connecting said third output terminal to any selected input terminal in said third plurality of input terminals notwithstanding the connection effected by said first stepping switch means;
  fourth stepping switch means having a fourth output terminal and a fourth plurality of input terminals, each input terminal in said fourth plurality of input terminals corresponding to an input terminal in said third plurality of input terminals and adapted for connection to a respective one in a plurality of reference terminals which corresponds to a respective one in a plurality of test terminals, for simultaneously connecting said fourth output terminal to an input terminal of said fourth plurality of input terminals that corresponds to the input terminal of said third plurality of input terminals then selectively connected to said third output terminal by said third stepping switch means;
  first constant current source means connected across said first and third output terminals for providing a first predetermined current so as to flow through a test circuit connected between an input terminal of said first plurality of input terminals and an input terminal of said third plurality of input terminals respectively connected to said first and third output terminals by said first and third stepping switch means;
  second constant current source means connected across said second and fourth output terminals for providing a second predetermined current so as to flow through a reference circuit connected between an input terminal of said second plurality of input terminals and an input terminal of said fourth plurality of input terminals respectively connected to said second and fourth output terminals by said second and fourth stepping switch means;

differential amplifier means connected to said first and second output terminals for comparing, in response to the application of said first and second predetermined currents, a first transient response voltage appearing at said first output terminal with respect to said third output terminal during a transient response period with, a second transient response voltage appearing at said second output terminal with respect to said fourth output terminal during said transient response period, and for providing a difference signal corresponding to the difference in amplitude between the compared first and second transient response voltages during said transient response period; and comparator means connected to said differential amplifier means for comparing the amplitude of said difference signal to a predetermined voltage threshold signal and for providing an alarm signal in response to the comparison of said difference signal and said predetermined voltage threshold signal when the amplitude of said difference signal exceeds said predetermined voltage threshold signal.

2. The system of claim 1 further comprising:

first logic means coupled to said first and second stepping switch means for generating a first series of gating signals and a cycle signal, said first and second stepping switch means responsive to said first series of gating signals so as to automatically connect in a predetermined sequence each of the corresponding selected input terminals in said first and second plurality of input terminals to said first and second output terminals respectively, said cycle signal being generated at the occurance of each repetition of said first series of gating signals; and second logic means coupled to said first logic means and to said third and fourth stepping switch means, and responsive to said cycle signal for generating a second series of gating signals, said third and fourth stepping switch means responsive to said second series of gating signals so as to automatically connect in a predetermined sequence each of the corresponding selected input terminals in said third and fourth plurality of input terminals to said third and fourth output terminals respectively, during each predetermined sequence of connection effected by said first and second stepping switch means.

3. The system of claim 1 further comprising:

indicator means coupled to said first and second logic means for indicating the pair of test terminals in a test circuit that are instantaneously connected to said first and third output terminals; and wherein said first and second logic means are coupled to said comparator means, and responsive to said alarm signal, for inhibiting a change in the then occurring first and second gating signals.

4. The system of claim 1 further comprising:

indicator means coupled to said first and third stepping switch means for indicating the pair of test terminals in a test circuit that are instantaneously connected to said first and third output terminals; and means coupled to said comparator means and to said first and third stepping switch means, and responsive to said alarm signal, for inhibiting a change in the then occurring connection to said first and third output terminals.

5. The system of claim 1 further comprising a pair of matching protective means each respectively connected across said first and third output terminals and said second and fourth output terminals for respectively limiting said first and second transient response voltages to a predetermined voltage level.

6. The system of claim 2 further comprising a pair of matching protective means each respectively connected across said first and third output terminals and said second and fourth output terminals for respectively limiting said first and second transient response voltages to a predetermined voltage level.

7. The system of claim 3 further comprising a pair of matching protective means each respectively connected across said first and third output terminals and said second and fourth output terminals for respectively limiting said first and second transient response voltages to a predetermined voltage level.

8. The system of claim 4 further comprising a pair of matching protective means each respectively connected across said first and third output terminals and said second and fourth output terminals for respectively limiting said first and second transient response voltages to a predetermined voltage level.

* * * * *